US010680177B2

(12) United States Patent
Park et al.

(10) Patent No.: US 10,680,177 B2
(45) Date of Patent: Jun. 9, 2020

(54) METHOD OF MANUFACTURING SHADOW MASK USING HYBRID PROCESSING AND SHADOW MASK MANUFACTURED THEREBY

(71) Applicant: AP SYSTEMS INC., Gyeonggi-do (KR)

(72) Inventors: Jong-Kab Park, Gyenggi-do (KR); Bo-Ram Kim, Gyenggi-do (KR); Jun-Gyu Hur, Busan (KR); Doh-Hoon Kim, Seoul (KR)

(73) Assignee: AP SYSTEMS INC. (KR)

( * ) Notice: Subject to any disclaimer, the term of this patent is extended or adjusted under 35 U.S.C. 154(b) by 178 days.

(21) Appl. No.: 15/744,029

(22) PCT Filed: Aug. 4, 2016

(86) PCT No.: PCT/KR2016/008600
§ 371 (c)(1),
(2) Date: Jan. 11, 2018

(87) PCT Pub. No.: WO2017/026742
PCT Pub. Date: Feb. 16, 2017

(65) Prior Publication Data
US 2018/0205018 A1  Jul. 19, 2018

(30) Foreign Application Priority Data
Aug. 10, 2015 (KR) .................. 10-2015-0112609

(51) Int. Cl.
*B23K 26/364* (2014.01)
*C23C 14/04* (2006.01)
(Continued)

(52) U.S. Cl.
CPC ...... *H01L 51/0011* (2013.01); *B23K 26/0622* (2015.10); *B23K 26/082* (2015.10);
(Continued)

(58) Field of Classification Search
CPC ............. B23K 26/0622; B23K 26/082; B23K 26/364; B23K 26/384; C23C 14/042;
(Continued)

(56) References Cited

U.S. PATENT DOCUMENTS

| 2015/0068455 A1* | 3/2015 | Lee ................. B05C 21/005 118/504 |
| 2017/0029957 A1* | 2/2017 | Moon ............. H01L 21/76804 |
| 2017/0107605 A1* | 4/2017 | Chun .................. B23K 26/386 |

FOREIGN PATENT DOCUMENTS

| KR | 1020000029265 A | 5/2000 |
| KR | 1020060080476 A | 7/2006 |

(Continued)

OTHER PUBLICATIONS

International Search Report: dated Nov. 24, 2016 for PCT Application No. PCT/KR2016/008600.

*Primary Examiner* — John A McPherson
(74) *Attorney, Agent, or Firm* — Mendelsohn Dunleavy, P.C.

(57) ABSTRACT

The present invention discloses a method of manufacturing a shadow mask, wherein hybrid processing is used to form a mask pattern on the shadow mask, the method includes: forming a laser-processed pattern by irradiating a laser beam from above a base; and forming a wet-etched pattern that continues from the laser-processing pattern, by performing wet etching from above the base or from below the base on which the laser-processed pattern is formed. The present invention uses hybrid processing including wet etching and laser processing for manufacturing a shadow mask. The method has an effect on solving the productivity degradation of the conventional laser processing and provides a shadow mask with high quality using wet etching.

20 Claims, 12 Drawing Sheets

(51) Int. Cl.
*H01L 51/00* (2006.01)
*B23K 26/0622* (2014.01)
*B23K 26/082* (2014.01)
*G03F 7/30* (2006.01)
*H01L 51/56* (2006.01)
*B23K 101/40* (2006.01)

(52) U.S. Cl.
CPC .......... *B23K 26/364* (2015.10); *C23C 14/042* (2013.01); *G03F 7/30* (2013.01); *H01L 51/56* (2013.01); *B23K 2101/40* (2018.08)

(58) Field of Classification Search
CPC .... H01L 51/0011; H01L 51/56; G03F 7/0015; G03F 7/2053
USPC .................................. 430/320, 945; 216/12
See application file for complete search history.

(56) References Cited

FOREIGN PATENT DOCUMENTS

| | | |
|---|---|---|
| KR | 1020130013990 A | 2/2013 |
| KR | 1020130142739 A | 12/2013 |
| KR | 1020140105239 A | 9/2014 |

\* cited by examiner

A : PR width
B : width
D : depth

E=(B−A/2) ---------------- formula(1)
Etch factor = D/E ---------------- formula(2)

→B=2D/ Etch factor + A ---------------- formula(3)

Ex) 50=2*15/1.0+A
     A=20 laser processing (upper surface)

wet etching (upper surface)

laser processing (upper surface)

wet etching (lower surface)

OVERLAPPING OF LASER
BEAMS ON EACH SCAN PATH

SECTION OF THREE
DIMENSIONAL STRUCTURE

METHOD OF MANUFACTURING SHADOW MASK USING HYBRID PROCESSING AND SHADOW MASK MANUFACTURED THEREBY

TECHNICAL FIELD

The present invention relates generally to a method of manufacturing a metal shadow mask and a shadow mask manufactured by the method. More particularly, the present invention relates to a method of manufacturing a metal shadow mask, wherein hybrid processing including wet etching and laser processing is used to form a mask pattern including a wet-etched pattern and a laser-processed pattern on the shadow mask, and a shadow mask manufactured by the method.

BACKGROUND ART

Metal masks are generally used for a vacuum deposition process while manufacturing an organic electroluminescence (EL) device, an organic semiconductor element, etc.

Such metal masks have a three dimensional (3D) structure that has a plurality of circular holes or tapered structures. Semiconductor elements such as organic EL devices are manufactured by arranging the metal mask on a substrate and depositing a luminescence layer of a desired pattern to a specific area of the substrate.

U.S. Pat. Nos. 5,348,825 and 5,552,662 disclose conventional wet etching methods used to manufacture a metal mask, the methods include a chemical wet etching method of manufacturing a shadow mask. The shadow mask that is applied in present industrial sites is the chemical wet etching type.

A brief explanation of conventional wet etching is described below with reference to FIG. 1.

1. Resist coating: coating a photoresist 2 on both sides of a metal film 1.
2. Pattern coating: performing an exposure process on the photoresist 2 by using a glass mask pattern 3 (or quartz mask).
3. Developing: after the glass mask pattern 3 (or quartz mask) transcription on an upper surface of the photoresist 2, removing the glass mask 3 used for forming the pattern and selectively removing the photoresist 2 by performing a development process.
4. First etching: performing wet etching on the upper surface of the photoresist 2, in which the pattern is formed, to remove a part of a metal film 1 whereby the photoresist 2 is removed (aperture of the photoresist 2) by using an etching solution.
5. Filling: filling an anti-etching packing material in the upper surface of the metal film 1 in which the part thereof is removed. The anti-etching packing material is filled to protect a shape of the upper surface of the metal mask famed by the first etching while performing etching to a lower surface of the metal film 1.
6. Second etching: etching the lower surface of the metal film 1.
7. Removing: removing the anti-etching packing material and the photoresist, and finally obtaining the metal shadow mask.

The above process lists a typical process of manufacturing the metal shadow mask by using wet etching, and various modifications are developed from the above process. For example, the step "5. Filling" may be skipped, or both sides of the metal film are etched at the same time. However, the metal mask is generally manufactured by using the technique of chemical wet etching described in FIG. 1.

Wet etching has an isotropic characteristic as shown in FIG. 2. In other words, the metal film is removed while the metal film is identically affected by the etching solution in all directions from the aperture of the photoresist. Thus, a cross sectional shape of the metal film is formed to have a semicircle shape, as shown in FIG. 3. Thus, the metal mask that is finally formed on the metal film includes an aperture in which peripheries of the aperture (see the encircled portion in the drawing) are very thin.

Thus, the thinness of peripheries of the aperture may have a bad effect on precisely and stably securing a size or shape of the aperture.

For this reason, wet etching of the metal mask is not generally performed on one side (upper surface or lower surface) of the metal film, but performed on both sides of the metal film as shown in FIG. 3. Wet etching is performed on both sides of the metal film by using various methods that are disclosed in U.S. Pat. Nos. 5,348,825, 5,552,662, etc.

A cross line (cross point in a cross sectional view), in which a mask formed on the upper surface and a mask formed on the lower surface intersect to each other, is formed by using conventional methods. In addition, the metal mask including a taper structure (32 in FIG. 3) with a small size may be implemented by performing wet etching with a weak strength on any one side of the metal mask. Size and shape of the aperture may be secured by using such a taper structure. For this reason, heights of undercut (t in FIG. 3) are claimed to be 30~40% of the entire thickness T of the metal mask in the prior art.

However, such a taper structure is formed by the isotropic characteristic of wet etching, thus it may be famed to have the undercut shape.

The metal mask having such an undercut shape shows its limit when depositing an electroluminescence material to a substrate of display devices by using such a metal mask. When depositing the electroluminescence material through the aperture of the metal mask, the electroluminescence material is not uniformly deposited on the substrate due to the undercut shape.

In other words, the undercut shape causes a gradual deposition of the electroluminescence material on a position of the substrate corresponding to the undercut shape. As a result, a performance degradation of the display device occurs when manufacturing by using such a metal mask.

Meanwhile, it is known that at present wet etching may be applied up to 300 ppi (pixel per inch). However, it is difficult to use conventional wet etching methods to produce display devices having resolutions of QHD (approximately 500 ppi) or UHD (approximately 800 ppi).

FIG. 4 is a view of explaining an isotropic shape of conventional wet etching (formulas of (1), (2), and (3) show correlations between factors of the shape (A, B, D, E, T, pitch, and Etch factor)), and through interaction formulas between factors of the shape.

The limit of implementing high resolutions of display devices when using wet etching can be explained. Thus, the figure does not show wet etching that is performed on both sides of the base.

Generally, the higher the resolution that is required, the smaller the value of pitch in FIG. 4 that is required, and thus a value of width B should also be smaller. According to a formula (3), in order to get a smaller value of width B, a smaller value of PR width A or depth D is required.

However, the value of PR width A cannot become an infinitely small value because it is difficult to obtain a very small value of PR width A due to the characteristic of an exposure process. Although an infinitely small value is obtained, it may cause degradation of an etching factor.

In addition, there is also a limit to set the depth value D to a small value. This is because, although the method of etching both sides of the metal mask is used, referring to FIG. 3, the size of the undercut becomes larger when the depth D value becomes smaller, thus the electroluminescence material is not uniformly deposited on the substrate. Further, a thickness T of the metal mask cannot be decreased since there is a minimal thickness required to handle the metal sheet during wet etching.

In addition, it is also difficult to implement display devices with high resolutions by only performing wet etching. The reason may be found on fine structures shown in a top plan view.

The isotropic characteristic of wet etching is shown not only in the cross sectional shape of the mask but also in the top planar shape of the mask. As shown in FIG. 5, an actual processed 3D shape of the mask has a bowl shape, thus four edges of the mask are rounded and not sharp. Such characteristics are characteristics that are difficult to be applied in display devices that require sharp quadrangular or polygonal deposition areas. In particular, it is difficult for such characteristics to be applied in display devices with high resolutions such as QHD or UHD.

Therefore, it is difficult to implement display devices having resolutions of QHD (approximately 500 ppi) or UHD (approximately 800 ppi) by using conventional wet etching due to limits and correlations between factors of the shape described above.

In addition, there is a limit to implement a wet-etched pattern that has a certain radius of curvature of a wet-etched surface by using conventional wet etching due to the isotropic characteristic thereof, and thus, it is difficult to implement apertures having various shapes.

Meanwhile, recently, a metal shadow mask is manufactured by using an ultrashort pulse laser. Korean Patent Application Publication Nos. 10-2013-0037482 and 10-2015-0029414 are typical techniques, and the applicant of the present invention has also filed applications for the related inventions (Korean Patent Application Nos. 10-2014-0182140 and 10-2015-0036810).

FIG. 6 is a view of showing a basic process of manufacturing a metal shadow mask by using a laser.

A method of manufacturing a metal shadow mask by using laser includes:

1. a first irradiating step of irradiating a laser beam onto a substrate while moving the laser beam along a first looped curve that corresponds to a shape of mask hole; and 2. a second irradiating step of irradiating the laser beam onto the substrate while moving the laser beam along a second looped curve that is provide inside the first looped curve and has a smaller internal area than that the first looped curve.

3. In addition, another method of manufacturing a metal shadow mask by using laser includes: a first irradiating step of irradiating laser beam having a first energy onto a position in which a mask hole is famed on a substrate; and a second irradiating step of irradiating the laser beam having a second energy that is lower than the first energy onto the same position onto which the laser beam of the first irradiating step is irradiated.

The method of manufacturing a metal shadow mask by using such a laser, in order to improve an accuracy of the processed metal mask, generally uses an ultrashort pulse laser. The metal base is gradually removed or processed by the accumulation of various low-intensity pulses by using the ultrashort pulse laser.

Such method using the laser has an effect of specifying an energy distribution or intensity of the laser beam irradiated onto the metal base by configuring a specific optical system or changing the intensity change of the laser or pulse modulation.

For example, it may be possible to manufacture a metal mask having a proper taper structure without including undercut by configuring an optical system having specific energy distribution and controlling the laser and a relative motion of the substrate (Refer to FIG. 7).

However, the biggest limitation of the above method is that it is difficult to ensure productivity capable of being used in industrial sites.

In other words, the metal processing method using the laser continuously applies energy to the metal base in pulse train of the laser and induces a removal of the metal material of the base that is gradually removed from the surface of the metal base. Herein, processing speed (amount of removed material) may be increased by applying increasing the intensity of the laser irradiated to the metal base. However, heat due to the high energy applied to the metal base cannot be sufficiently dissipated and is accumulated on the metal base, thus the accumulated heat causes degradation of processing quality. In conclusion, in order to ensure a high quality shadow mask, the metal material should be gradually processed by applying multiple laser pulses having a minimum energy required for the processing. However, it is difficult to ensure sufficient productivity by using such method.

DISCLOSURE

Technical Problem

The present invention has been proposed to solve the problems in the related art and an object of the present invention is to provide a method of manufacturing a shadow mask, wherein hybrid processing including wet etching and laser processing is used to form a mask pattern including a laser-processed pattern and a wet-etched pattern on the shadow mask, and a shadow mask manufactured using the method.

Technical Solution

In order to achieve the above object, according to one aspect of the present invention, there is provided a method of manufacturing a shadow mask, wherein hybrid processing is used to form a mask pattern on the shadow mask, the method includes: forming a laser-processed pattern by irradiating a laser beam from above a base; and forming a wet-etched pattern that continues from the laser-processing pattern, by performing wet etching from above the base or from below the base on which the laser-processed pattern is formed.

Also, the forming of the laser-processed pattern may include: a first step of setting a unit processing area on the base; a second step of performing laser processing to form a part of the laser-processed pattern within the unit processing area while moving the laser beam along a first scan path from a first boundary to a second boundary of the unit processing area; a third step of turning the laser beam to a next direction, moving the laser beam by a step pitch, and performing laser processing to form another part of the laser-processed pattern within the unit processing area while moving the laser beam along a second scan path; and a fourth step of repeating the second and third steps until finishing laser processing while moving the laser beam along an nth scan path, thereby completing laser processing over an entire area of the unit processing area.

Further, the forming of the laser-processed pattern may further include setting a processing depth for each of the scan paths.

In addition, the processing depth may be determined by an overlap rate of the laser beam moving along the scan path [overlap rate={(size of laser beam−scan pitch)/size of laser beam}×100, scan pitch=v/f, v: relative speed of laser beam and base operated by operating part, f: pulse frequency of laser beam source applied to base], by a number of overlaps of the scan path, by setting intensity of the laser beam for each scan path, by setting energy intensity for each pulse of a laser beam source within one scan path, or by setting a combination of the two, or the processing depth may be determined by a combination of two or more of the following: an overlap rate of the laser beam [overlap rate={(size of laser beam−scan pitch)/size of laser beam}×100, scan pitch=v/f, v: relative speed of laser beam source and base operated by operating part, f: pulse frequency of laser beam source applied to base]; a number of overlaps of the scan path; and a setting of intensity of the laser beam for each scan path, or a setting of energy intensity for each pulse of a laser beam source.

Also, the laser-processed pattern may be formed by setting the first to $n^{th}$ scan paths and first to $m^{th}$ scan paths, the first to $m^{th}$ scan paths being perpendicular to the first to $n^{th}$ scan paths.

Herein, the laser-processed pattern may be formed to be tapered by setting an accumulated energy distribution to a sequence of intensity of the laser beam according to the scan path.

Also, the forming the laser-processed pattern may further include: setting a plurality of energy areas on a laser-processed pattern area within the unit processing area; and setting a processing depth for each of the energy areas by setting an accumulated energy distribution by the energy areas according to a sequence of intensity of the laser beam.

Herein, the accumulated energy distribution by the energy areas may be set by a number of overlaps of the scan path, or by setting an energy intensity change for each pulse of a laser beam source moving along the scan path.

Further, the laser-processed pattern may be formed to be tapered by setting the accumulated energy distribution by the energy areas by sequentially setting a number of overlaps of the scan path, or by sequentially setting energy intensity for each pulse of a laser beam source moving along the scan path.

In addition, a step pitch of the laser beam turning from an $n-1^{th}$ scan path to the $n^{th}$ scan path may be equal to or smaller than a size of the laser beam of the $n-1^{th}$ scan path.

Also, the laser beam of the $n^{th}$ scan path may move in a direction same as or opposite to a direction of an $n-1^{th}$ scan path.

Also, an $n-1^{th}$ scan pitch and an $n^{th}$ scan pitch may be set to have different values according to a shape of the laser-processed pattern (scan pitch=v/f, v: relative speed of laser beam and base operated by operating part, f: pulse frequency of laser beam source applied to base).

Meanwhile, the forming the wet-etched pattern may include: forming a photoresist pattern on an upper surface of the base to form the wet-etched pattern, and performing wet etching on the base along a photoresist-removed area.

Herein, at the forming the wet-etched pattern, wet etching may be performed on one surface of the base in a direction same as or opposite to a laser processing direction, or may be sequentially or simultaneously performed on both surfaces of the base.

Also, the wet-etched pattern famed by wet etching may be formed in the direction same as or opposite to the laser processing direction to continue from a laser-processed surface of the laser-processed pattern.

In addition, the wet-etched pattern that is formed in the direction opposite to the laser processing direction to continue from the laser-processed surface of the laser-processed pattern, may be formed up to or less than 40% of an entire thickness of the base.

Also, the wet-etched pattern may have a radius of curvature of a wet-etched surface of the wet-etched pattern, the radius of curvature being smaller than a processing depth of the wet-etched pattern.

Advantageous Effects

The present invention uses hybrid processing including wet etching and laser processing for manufacturing a shadow mask. The method has an effect on solving the productivity degradation of the conventional laser processing and provides a shadow mask with high quality using wet etching.

In addition, the undercut problem caused by the isotropic characteristic of wet etching is solved by using hybrid processing including wet etching processing and laser processing. Accordingly, the gradual deposition of an electro luminescence material that is deposited on the substrate is prevented, boundary parts in which the electro luminescence material is deposited become clear, and thus there is an effect on improving performance of display devices.

Further, in the present invention using hybrid processing, most of the aperture shape is formed by laser processing, and a radius value of curvature of a wet-etched surface of the wet-etched pattern is implemented below a limit value of wet etching by adjusting energy level of the laser beam for each position. Further, the radius value of curvature for the wet-etched surface of the wet-etched pattern may be adjusted to a certain value below the limit value. Accordingly, there is an effect on implementing various shapes of apertures.

Also, factors of the shape that are used for forming the mask pattern are not restricted to their limitations by using hybrid processing including wet etching and laser processing, and thus the shadow mask of the present invention may be used for implementing display devices having resolutions of QHD (approximately 500 ppi) or UDH (approximately 800 ppi).

MODE FOR INVENTION

The present invention generally relates to a method of manufacturing a metal shadow mask used for a deposition process while manufacturing an organic EL devices or an organic semiconductor. More particularly, the present invention relates to a method of manufacturing a metal shadow mask, wherein hybrid processing including wet etching and laser processing are used to form a mask pattern having a laser-processed pattern and a wet-etched pattern on the shadow mask.

Thus, productivity degradation of conventional laser processing may be solved, and a shadow mask with high quality is provided by performing wet etching.

Figure 8:
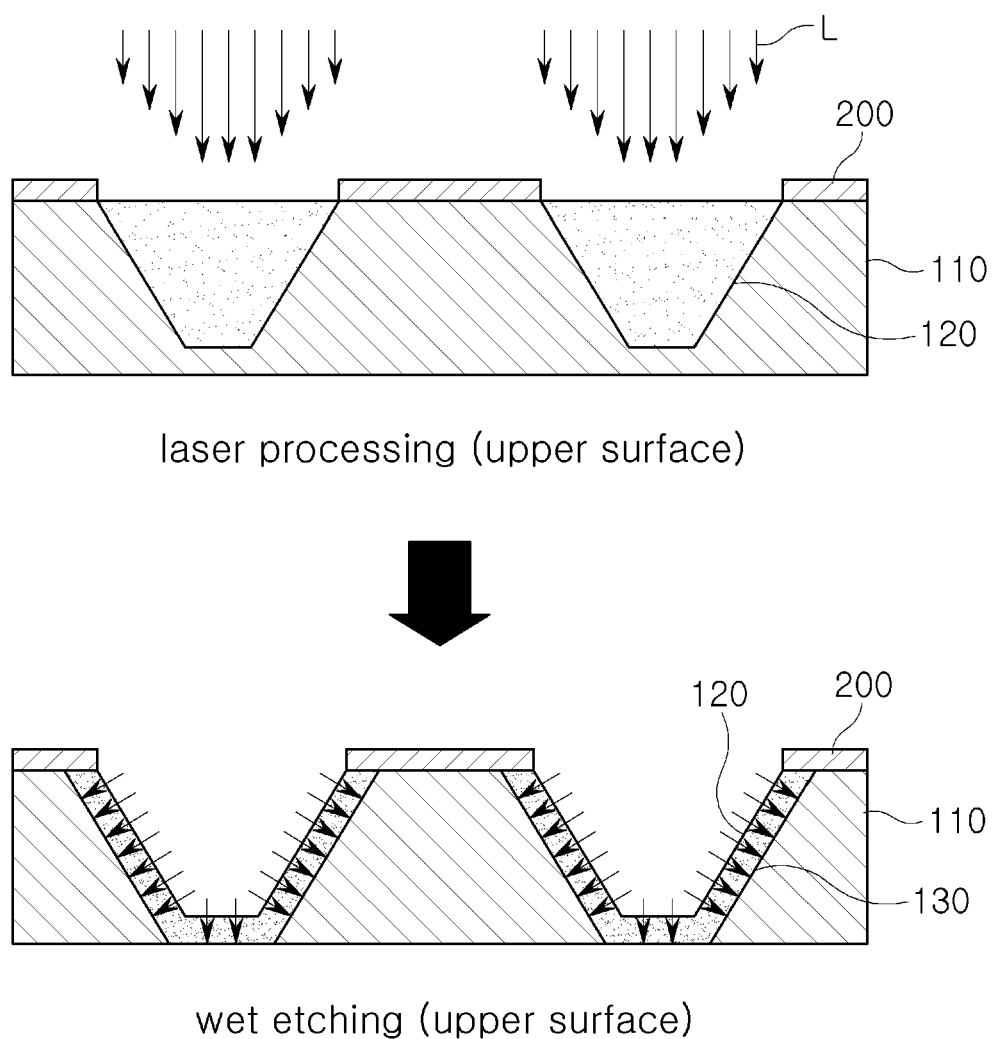
FIG. 8 is a schematic view of a method of manufacturing a shadow mask according to an embodiment of the present invention.

Hereinafter, exemplary embodiments of the present invention will be described in detail with reference to the accompanying drawings. FIG. 8 is a schematic view of a method of manufacturing a shadow mask according to an embodiment of the present invention, FIG. 9 is a schematic view of a method of manufacturing a shadow mask according to another embodiment of the present invention, and FIGS. 10 to 16 are schematic views of laser processing according to various embodiments of the present invention.

Figure 9:
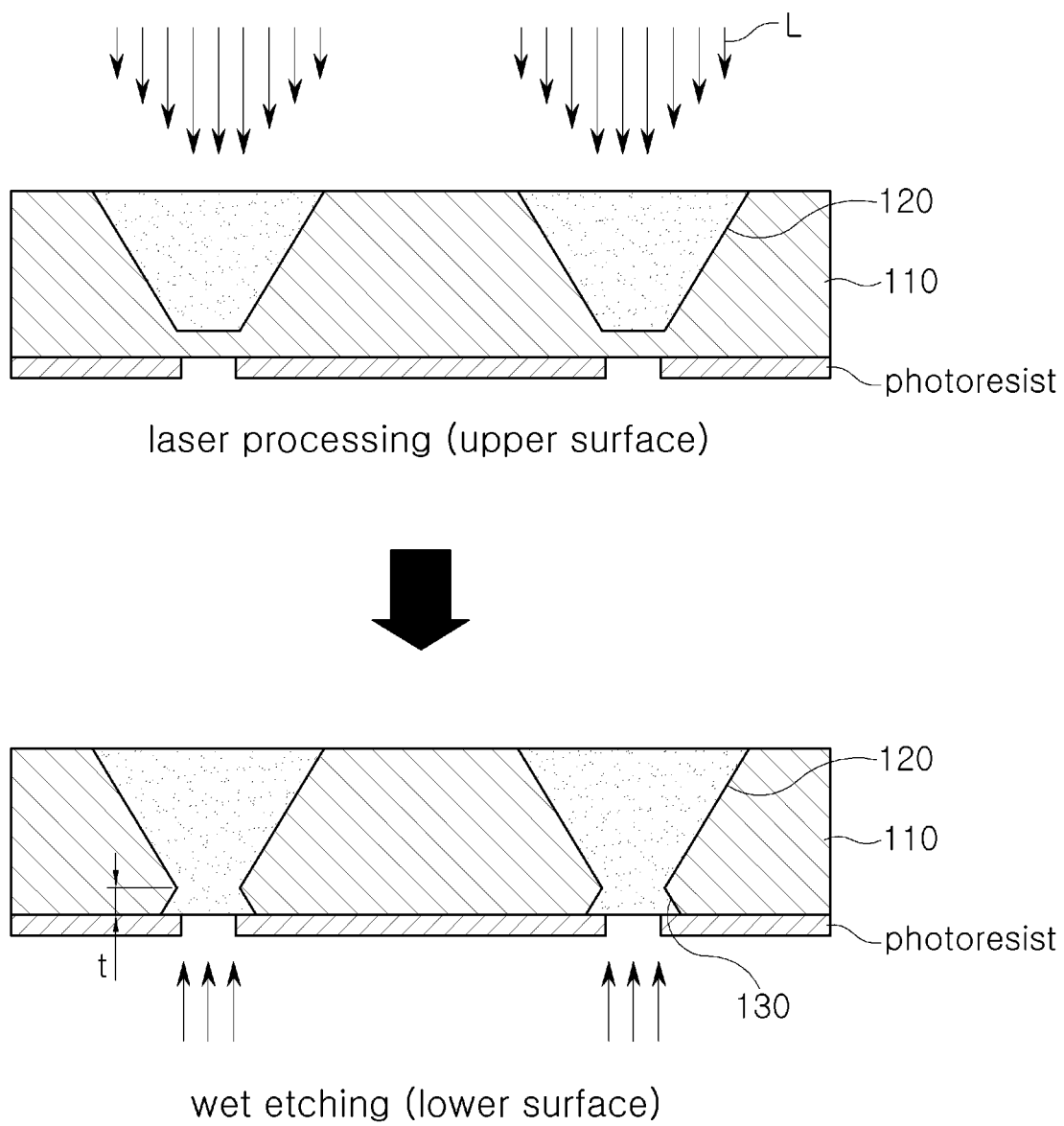
FIG. 9 is a schematic view of a method of manufacturing a shadow mask according to another embodiment of the present invention.

As shown in FIGS. 8 and 9, in a method of manufacturing a shadow mask according to an embodiment of the present invention, hybrid processing is used to form a mask pattern on the shadow mask. The method includes: forming a laser-processed pattern 120 on a base 110 by irradiating a laser beam from above the base 110; and forming a wet-etched pattern 130 that continues from the laser-processed pattern 120, by performing wet etching from above or from below the base 110 on which the laser-processed pattern 120 is formed.

In other words, the method of present invention manufactures the shadow mask that includes the mask pattern having the wet-etched pattern 130 and the laser-processed pattern 120.

Herein, a plurality of mask patterns formed on the shadow mask has a shape corresponding to a shape of a thin film pattern to be deposited on a substrate. The mask patterns are areas through which a deposition material passes, and areas other than the plurality of mask pattern areas on the base 110 are blocking areas through which the deposition material cannot pass.

In other words, the shadow mask is configured to have the mask pattern that includes blocking areas through which the deposition material cannot pass and a plurality of mask patterns that are formed to be mutually separated from each other and the blocking area. As described above, the mask pattern of the shadow mask refers to an arranged shape or arranged configuration of the plurality of mask patterns.

The present invention discloses a method for manufacturing a shadow mask having such mask patterns, and discloses a method of manufacturing the shadow mask, wherein hybrid processing is used to form the mask pattern having the laser-processed pattern formed by laser processing and the wet-etched pattern formed by wet etching.

FIG. 8 is a schematic view of the method of manufacturing the shadow mask according to an embodiment of the present invention. The laser-processed pattern 120 is formed on the base 110 by irradiating the laser beam L from above the base 110 (upper surface of the base 110), and the wet-etched pattern 130 that continues from the laser-processed pattern 120 is formed by performing wet etching from above the base 110 (upper surface of the base 110) on which the laser-processed pattern is formed 120.

FIG. 9 is a view showing a method of manufacturing a shadow mask according to another embodiment of the present invention. The laser-processed pattern 120 is famed on the base 110 by irradiating the laser beam L from above the base 110 (upper surface of the base 110), and the wet-etched pattern 130 is famed on the base 110 that continues from the laser-processed pattern 120, by performing wet etching from below the base 110 (lower surface of the base 100) on which the laser-processed pattern 120 is formed.

Herein, it is preferable to form the laser-processed pattern 120 by laser processing such that an inner diameter gradually tapers toward the lower surface of the body 110. The wet-etched pattern 130 is formed by wet etching in a direction same as or opposite to a laser processing direction after completing such laser-processed pattern 120.

The laser-processed pattern 120 is formed on the base 110 by laser processing, and thus a shape processing of fine structures of the shadow mask is performed first.

In the present invention, high intensity of the laser beam is applied to the base compared with conventional laser processing, and thus processing quality of a surface of the metal material is a minimally degraded by a thermal accumulation effect, but an approximate shape of the fine structures are rapidly formed on the base.

Herein, quality of the laser-processed pattern 120 becomes worse since an accumulated energy pulse close to a lower part of the aperture becomes larger. Thus, the wet-etched pattern 130 is formed by wet etching on a surface of the laser-processed pattern 120, such that a smooth surface of the mask pattern is obtained. Therefore, it is possible to form a metal shadow mask with good quality.

A method of forming the laser-processed pattern by laser processing includes: a first step of setting a unit processing area on the base; a second step of performing laser processing to form a part of the laser-processed pattern within the unit processing area while moving the laser beam along a first scan path from a first boundary to a second boundary of the unit processing area; a third step of turning the laser beam to a next direction, moving the laser beam by a step pitch, and performing laser processing to form another part of the laser-processed pattern within the unit processing area while moving the laser beam along a second scan path; and a fourth step of repeating the second and third steps until finishing laser processing while moving the laser beam along an $n^{th}$ scan path, thereby completing laser processing over an entire area of the unit processing area.

The laser-processed pattern is formed in an intaglio shape from a surface of the base, and the unit processing area of the present invention refers to an area in which the laser-processed pattern is formed by setting a laser processing device at once. Alternatively, a user may set the unit processing area by randomly designating a specific area on the base. Such a unit processing area may include one or more laser-processed patterns. It is preferable to set the unit processing area to be large considering processing speed.

Such a unit processing area may be set one time or plural plurality of times. The laser-processed pattern continuing from the wet-etched pattern is completed when the unit processing area is completely processed.

Figure 10:
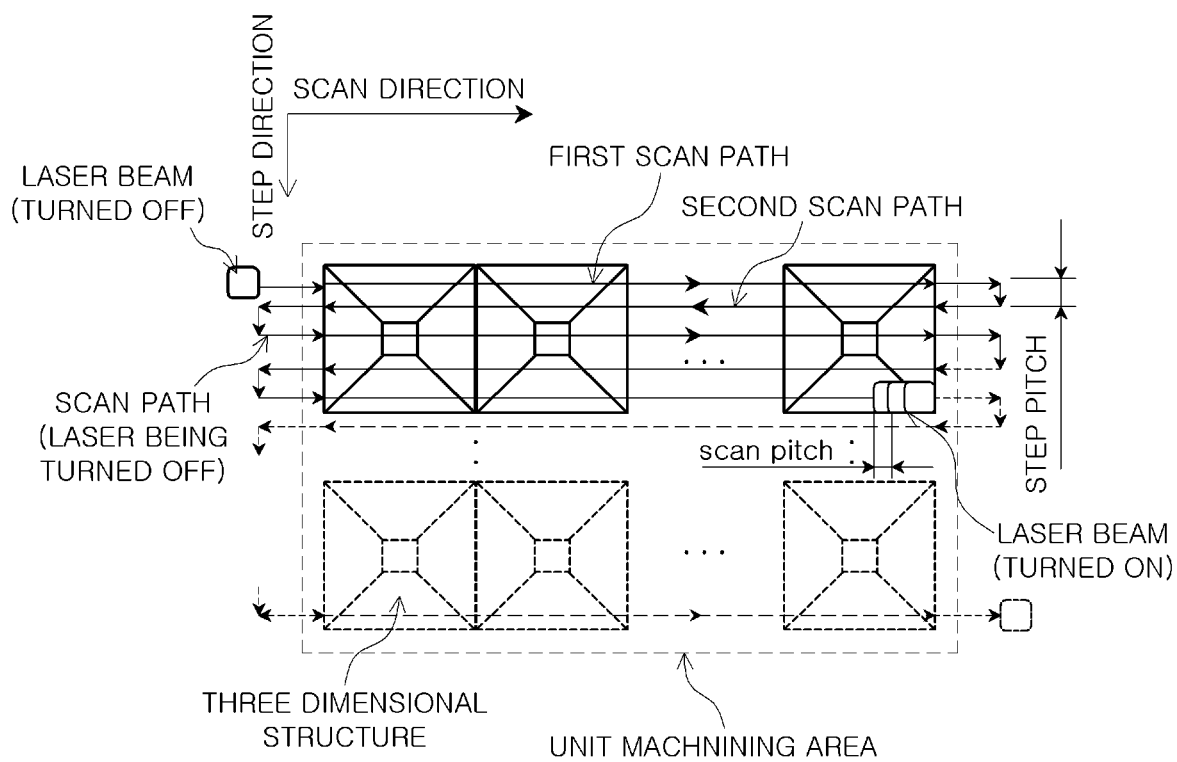
FIGS. 10 to 16 are schematic views of laser processing according to various embodiments of the present invention.

As shown in FIG. 10, in the method of forming the laser-processed pattern by laser processing on the base according to the present invention, first, the unit processing area is set on the base on which the wet-etched pattern is formed (first step).

The unit processing area may include one or plurality of laser-processed patterns, and is set as a virtual area on the base.

In detail, a length of the unit processing area refers to a length in which the laser beam is capable of moving along one scan path without turning direction thereof. A width of the unit processing area is generally set to a step pitch that will be described later in which the laser beam turns the direction thereof.

When setting such a unit processing area, the unit processing area is totally processed without dividing and processing several times the unit processing area by setting the unit processing area in which the entire area of the laser-processed pattern is included within thereof. A stitching problem that is caused by dividing and processing the entire area of a processing object into several numbers by using a conventional scanner device may be removed.

In addition, it is possible to remove a stitching effect while processing a large sized base by setting the unit processing area to be identical to the large sized base.

Then, the laser beam moves along a first scan path from the first boundary of the unit processing area to the second boundary of the unit processing area, and the laser beam processes a part of the laser-processed pattern included within the unit processing area (second step).

In other words, the first scan path is set from one boundary of the unit processing area to another boundary of the unit processing area, and the laser beam processes a part or the entirety of the laser-processed pattern included within the unit processing area while moving along the first scan path.

When the laser beam reaches the another boundary of the unit processing area by moving along the first scan path, then the laser beam turns its direction to a next step, moves by a step pitch and processes another part of the laser-processed pattern while moving along the second scan path (third step).

In other words, when the laser beam reaches another boundary of the unit processing area, the laser beam is turned off, turns to the next step, and moves by the step pitch. Then, the second scan path is set, and herein, the laser beam is turned on.

The step pitch refers to a distance between neighboring scan paths, for example, a distance between the first scan path and the second scan path, and refers to a distance from the center of the laser beam moving along the first scan path to the center of the laser beam moving along the second scan path.

Herein, as shown in FIG. 10, the first scan path and the second scan path may be set to have same directions, alternatively, may be set to have opposite directions. In other words, the laser beam may be set to move in the opposite direction. In other words, an $n-1^{th}$ scan path and an $n^{th}$ scan path may be set such that the laser beam moves in a direction same as or opposite to each other. However, it is not limited thereto, and several scan paths may be set to a specific direction, or to opposite to the specific direction, or to a combination of the two.

In addition, the step pitch in which the laser beam turns its direction from the first scan path to the second scan path is set to be equal to or smaller than a size of the laser beam of the first scan path such that an uniform patterning is processed. In other words, the step pitch in which the laser beam turns its direction from an $n-1^{th}$ scan path to an $n^{th}$ scan path is equal to or smaller than a size of the laser beam of the $n-1^{th}$ scan path.

In addition, an $n-1^{th}$ scan pitch and an $n^{th}$ scan pitch may be set to be different to each other according to a shape of the laser-processed pattern. Herein, the scan pitch follows the formula: scan pith=v/f (v: relative speed of laser beam and base operated by operating part, f: pulse frequency of laser beam source applied to base). The scan pitch refers to a distance between consecutive laser beams and is determined by considering a relative speed of the laser beam and the base, and a pulse frequency of the laser beam source.

Such a scan pitch is used for a reference to set an overlap rate of the laser beam which will be described later, and when the scan pitches becomes narrower, the overlap rate is increased. The overlap rate has an effect on setting a processing depth of the laser-processed pattern.

Next, the first step and the second step are repeated until finishing laser processing while moving the laser beam along an $n^{th}$ scan path, thereby completing laser processing over an entire area of the unit processing area (fourth step).

As shown in FIG. 10, the laser beam processes the part of the laser-processed pattern within the first scan path from the first boundary of the unit processing area while moving along the first scan path. When the laser beam reaches the second boundary of the unit processing area, the laser beam turns its direction to the next step, moves by the step pitch, processes the another part of the laser-processed pattern while moving along the second scan path and reaches back to the first boundary of the unit processing area. The above processes are repeated until the $n^{th}$ scan path is set, and then the laser beam processes the laser-processed pattern while moving along the $n^{th}$ scan path and reaches on one of the boundaries of the unit processing area, thereby the laser beam completes laser processing over the entire area of the unit processing area.

Thus, a number of direction turnings of the laser beam occurring during laser processing is remarkably reduced (processing by moving along the scan path->turning to the next step and moving). The laser-processed pattern is processed by repeatedly performing simple processing procedures. Thus, productivity of the laser-processed pattern is improved.

Therefore, the present invention discloses a method of forming the laser-processed pattern on the base continuing from the wet-etched pattern by using the laser beam. The unit processing area is set on the base, and laser processing is performed on each of the unit processing areas by setting the scan path in which the laser beam moves along the scan path to a specific scan pitch distance on the unit processing area. Accordingly, thermal energy accumulation is prevented, thus the base is protected and fine patterns can be formed on the base.

In addition, the laser-processed pattern included within the processing area includes several scan paths. Thus, in order to complete laser processing of the laser-processed pattern, laser processing is performed on the entire scan paths within the laser-processed pattern. Therefore, the thermal energy accumulation on the base is prevented by intermittently processing and giving pause time to laser processing while forming the laser-processed pattern, so the base is protected and fine patterns are formed on the base.

Meanwhile, when the laser beams moves along the scan path, a processing depth for each scan path may be set. In other words, a processing depth of the first scan path may be set to a specific value, a processing depth of the second scan path may be set to other specific value, and a processing depth of the $n^{th}$ scan path may be set to another specific value or to a value that is symmetrical to the scan path mostly placed in the center of the processing area. The processing depth may be variously set according to the shape of the laser-processed pattern, and setting such a processing depth may be implemented by controlling an accumulated energy distribution of the laser beam.

First, in order to set the processing depth, the processing depth is controlled by the overlap rate of the laser beam that moves along the scan path [overlap rate={(size of laser beam−scan pitch)/size of laser beam}×100, scan pitch=v/f, v: relative speed of laser beam and base operated by operating part, f: pulse frequency of laser beam source applied to base].

The processing depth according to the overlap rate of the laser beam may be set by fixing a pulse frequency value of the laser beam source and varying the relative speed of the laser beam for each scan path, or may be set by fixing the relative speed of the laser beam and varying the pulse frequency value for each scan path.

In other words, the overlap rate of the laser beam may be set by controlling the scan pitch according to the size of the laser beam. From the formula: scan pitch=v/f, a degree of the overlap rate of the laser beam for each scan path is controlled by adjusting values of the relative speed of the laser beam and pulse frequency. The processing depth is set by controlling the degree of the overlap rate, thus the deeper the processing depth is set, the larger the overlap rate of the laser beam is set.

Figure 11:
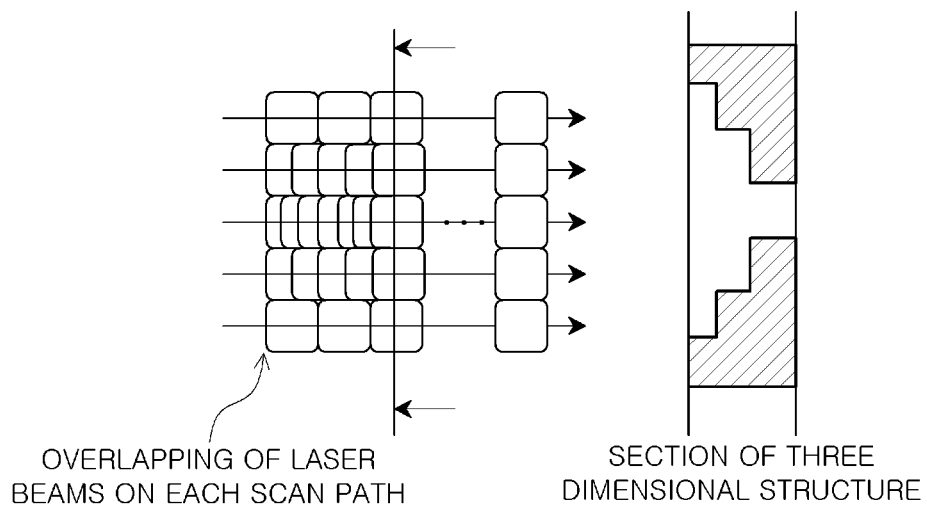

FIG. 11 is a schematic view of controlling the processing depth by the degree of the overlap rate of the laser beam, and shows a method of forming the laser-processed pattern having certain depth by controlling the overlap rate of the laser beam for each scan path.

Second, the processing depth may be set by controlling a number of overlaps of the scan paths. In other words, the processing depth of the laser-processed pattern may be set by controlling an accumulated energy distribution according to a number of movements of the laser beam within the same scan path.

In detail, the relative speed of the laser beam for each scan path and the pulse frequency value are fixed (in other words, the scan pitch is fixed), and the processing depth is set by selectively setting the number of overlaps of the scan path within the unit processing area.

Figure 12:
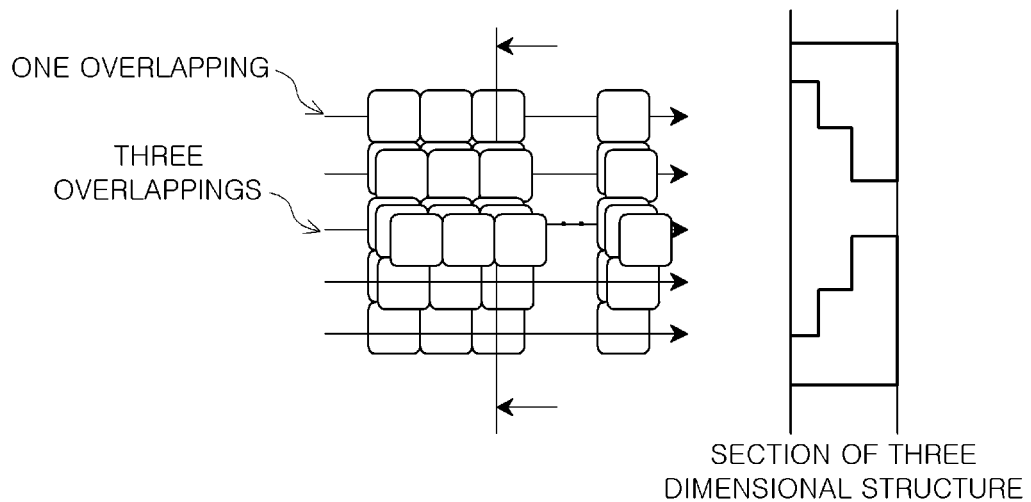

FIG. 12 is a schematic view of controlling the processing depth by the number of overlaps of the scan path, the laser-processed pattern is formed by controlling the number of overlaps of the laser beam for each scan path.

Third, the processing depth may be set by setting intensity of the laser beam for each scan path, by setting intensity of the laser beam for each pulse of the laser beam source within one same scan path, or by setting a combination of the two. In other words, the processing depth of the laser-processed pattern may be set by controlling the accumulated energy distribution of the laser beam according to an adjustment of energy intensity of the laser beam within the same scan path.

In detail, the relative speed of the laser beam for each scan path and the pulse frequency value are fixed (in other words, the scan pitch is fixed), and the energy intensity of the laser beam source is varied for each pulse while the laser beam moves along each scan path, or the energy intensity of the laser beam source is varied for each scan path.

Figure 13:
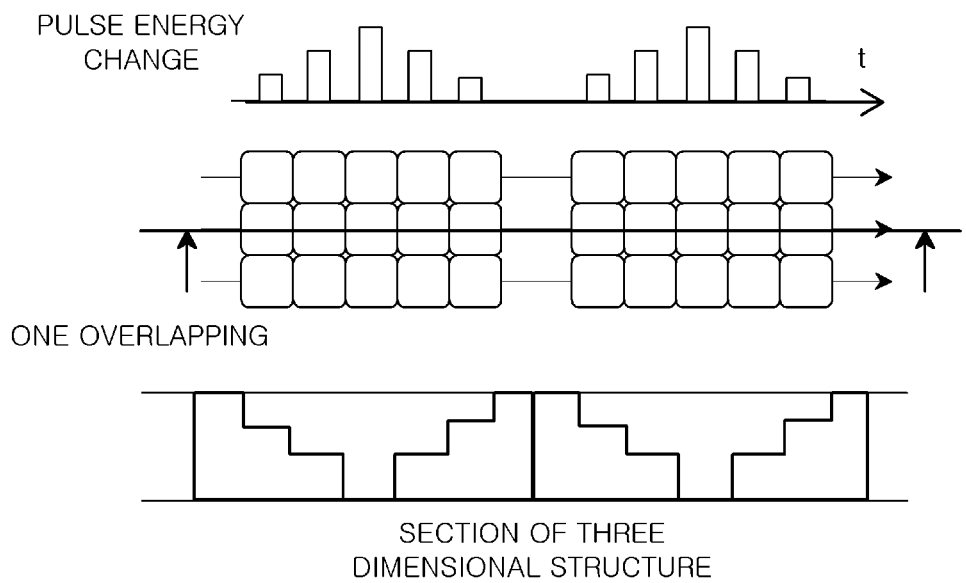

FIG. 13 is a schematic view of controlling the processing depth by varying energy intensity of the laser beam source for each pulse while the laser beam moves along each scan path. The laser-processed pattern having certain depth is formed by controlling the energy intensity of the laser beam source according to each scan path.

In order to set the processing depth, the processing depth may be determined by any one of, or a combination of two or more of, the overlap rate of the laser beam while moving along the scan path, the number of overlaps of the scan paths, and the energy intensity of the laser beam while moving along the scan paths.

Meanwhile, the laser-processed pattern may by formed by setting the first to the $n^{th}$ scan paths (a first direction) and first to $m^{th}$ scan paths (a second direction), the second direction is perpendicular to the first direction).

In order to form such laser-processed pattern, a tapered laser-processed pattern may be formed by setting an accumulated energy distribution by the scan path according to a sequence of intensity of the laser beam. In other words, while the scan path is set in two directions that are perpendicular to each other, the accumulated energy distribution is set by the scan path according to the sequence of intensity of the laser beam such that the processing depth to form the tapered laser-processed pattern is implemented.

Figure 14:
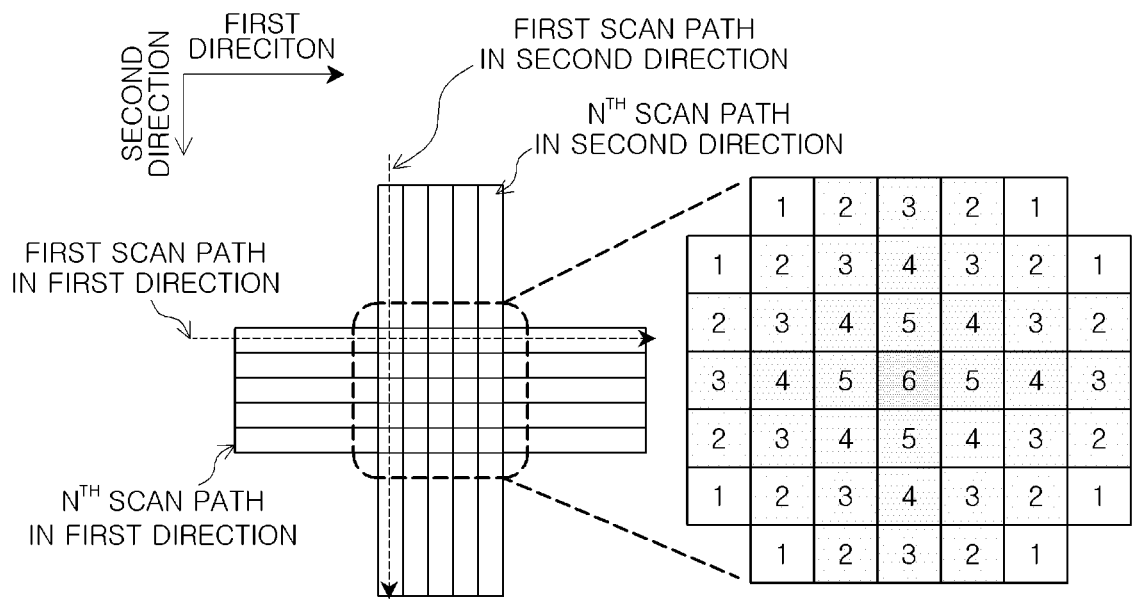

In detail, as shown in FIG. 14, the processing depth of the first scan path of the first direction, the $n^{th}$ scan path of the first direction, the first scan path of the second direction, and the $m^{th}$ scan path of the second direction are set to be identical. Processing depths for the other scan paths are set by using the same method.

For example, the processing depth of the second scan path of the first direction (=the $n-1^{th}$ scan path of the first direction=the second scan path of the second direction=the $m-1^{th}$ scan path of the second direction) is equal to or larger than the processing depth of the first scan path of the first direction (=the $n^{th}$ scan path of the first direction=the first scan path of the second direction=the $m^{th}$ scan path of the second direction). Processing depths for the other scan path are set by using the same method.

In addition, in a method of forming another tapered laser-processed pattern, a plurality of energy areas is set on a laser-processed pattern area within the unit processing area. A processing depth for the tapered laser-processed pattern may be set by setting the accumulated energy distribution by the energy areas according to the sequence of intensity of the laser beam.

In detail, an accumulated energy distribution assigned to a second energy area is equal to or larger than an accumulated energy distribution assigned to a first energy area, and an accumulated energy distribution is set by the energy areas according to the sequence of intensity of the laser beam.

Setting the accumulated energy distribution by the energy areas is performed by setting the number of overlaps of the scan path, or by setting the intensity of the laser beam moving along the scan path.

Figure 15:
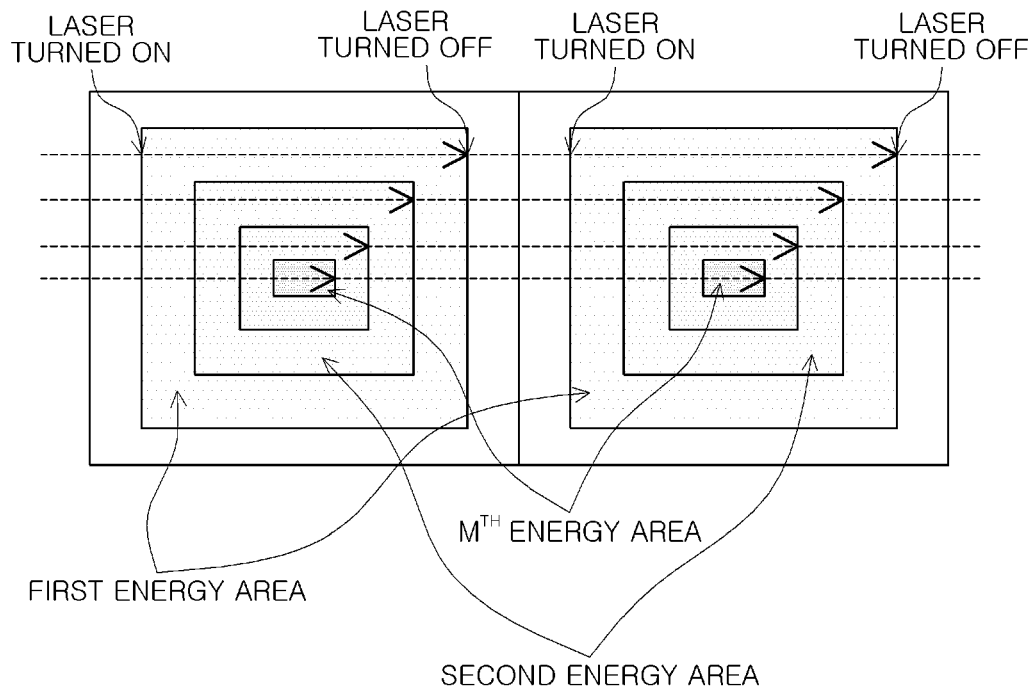

FIG. 15 is a view showing that accumulated energy distributions of the energy areas is controlled by the number of overlaps of the scan path. While the relative speed of the laser beam and values of the pulse frequency and the intensity of the laser beam are fixed, a specific number of overlaps of the scan path is set for an area of a first energy area that is not included in an intersection area between a first energy area and a second energy area.

A number of overlaps of the scan path of an area of the second energy area that is not included in an intersection area between the second energy area and a third energy area, is set to be equal to or larger than the specific number of overlaps of the scan path. The tapered laser-processed pattern is formed by controlling the accumulated energy distribution of the remaining energy areas by using the same method.

Figure 16:
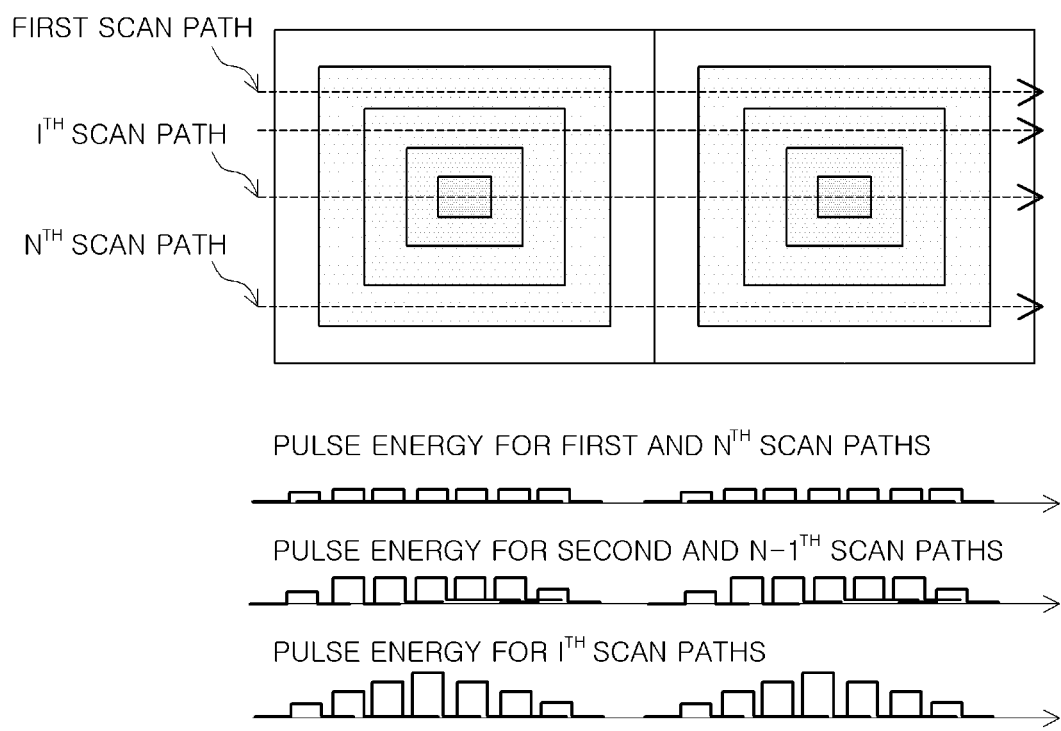

FIG. 16 shows a view in which the accumulated energy distribution for each energy area is controlled by an energy intensity change for each pulse of the laser beam source that moves along the scan path. Intensity of the energy pulse for each energy area is set to the same value. In other words, an identical pulse energy wave is set to a first scan path and an $n^{th}$ scan path.

As shown in FIG. 16, compared with a pulse energy wave of a first scan path (=$n^{th}$ scan path), energy intensity for each pulse of a pulse energy wave of a second scan path (=$n-1^{th}$ scan path) is respectively determined by energy areas.

Herein, the accumulated energy distribution by the energy areas according to the sequence of intensity of the laser beam may be set by setting a sequence of the number of overlaps of the scan path, or by setting a sequence of the pulse intensity of the laser beam source that moves along the scan path.

Thus, the present embodiment discloses a method of simply forming the laser-processed pattern by setting the processing depths for the scan paths, and the tapered laser-processed pattern is easily formed by controlling the total accumulated energy distribution for a specific scan path or energy area.

Meanwhile, the forming the wet-etched pattern includes forming a photoresist pattern on an upper or lower surface of the base 110 to form the wet-etched pattern 130, and performing wet etching on the base 110 along a photoresist-removed area.

Herein, the forming the wet-etched pattern may not require an additional development process when the photoresist is used for the masking part as the fourth embodiment.

As shown in FIG. 8, the forming the wet-etched pattern is performed in a direction same as a laser processing direction (upper surface of the base->upper surface of the base). Alternatively, as shown in FIG. 9, the forming the wet-etched pattern is performed in a direction opposite to the laser processing direction (upper surface of the base->lower surface of the base). According to the need, wet etching is sequentially or simultaneously performed on both sides of the base.

The wet-etched pattern 130 famed by wet etching, as shown in FIG. 8, is formed continuing from a laser-processed surface of the laser-processed pattern 120 formed by laser processing. Alternatively, as shown in FIG. 9, the wet-etched pattern 130 is formed continuing from the laser-processing surface of the laser-processed pattern 120 by performing wet etching in the direction opposite to the laser processing direction.

The wet-etched pattern 130 formed in the direction opposite to the laser processing direction to continue from the laser-processing surface of the laser-processed pattern 120 is formed up to or less than 40% of an entire thickness of the base 110. Dimension and shape stability of an aperture of a shadow mask are secured by the thickness of the wet-etched pattern (t in FIG. 9).

In addition, a radius of curvature of a wet-etched surface of the wet-etched pattern 130 is smaller than a processing depth of the wet-etched pattern 130.

Figure 1:
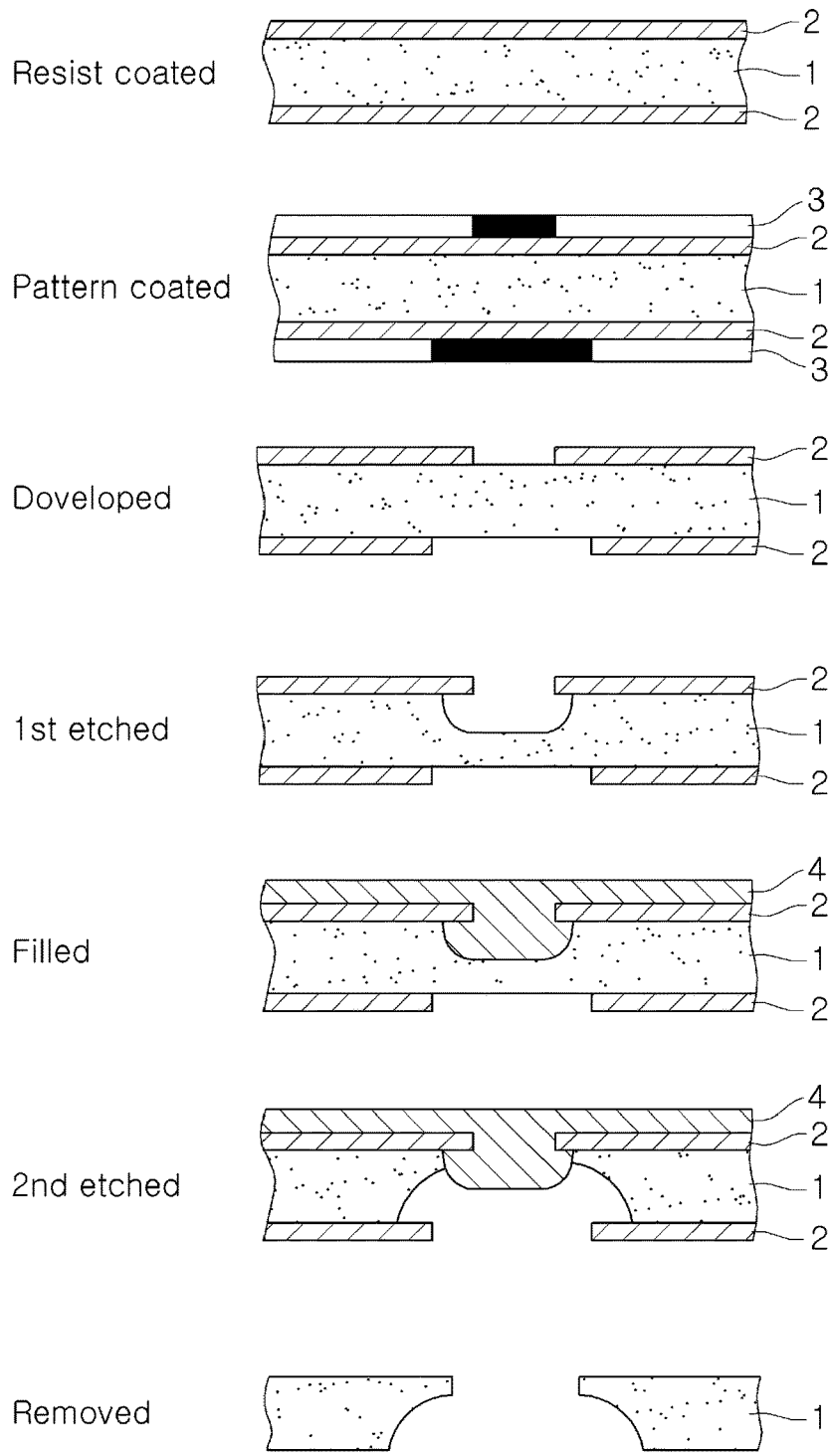
FIG. 1 is a schematic view of a method of manufacturing a shadow mask according to conventional chemical wet etching.
Figure 2:
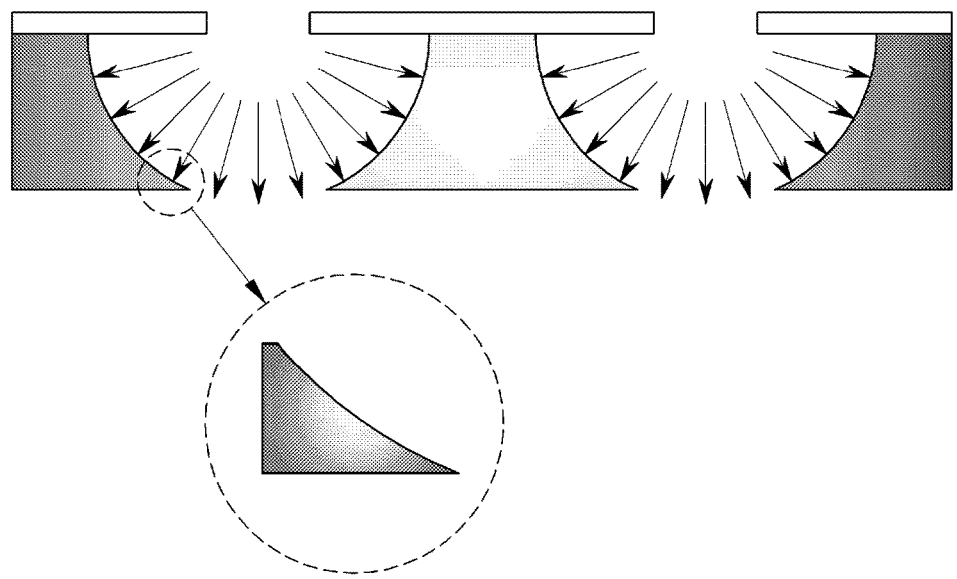
FIG. 2 is a schematic view of a shadow mask manufactured by conventional chemical wet etching.
Figure 3:
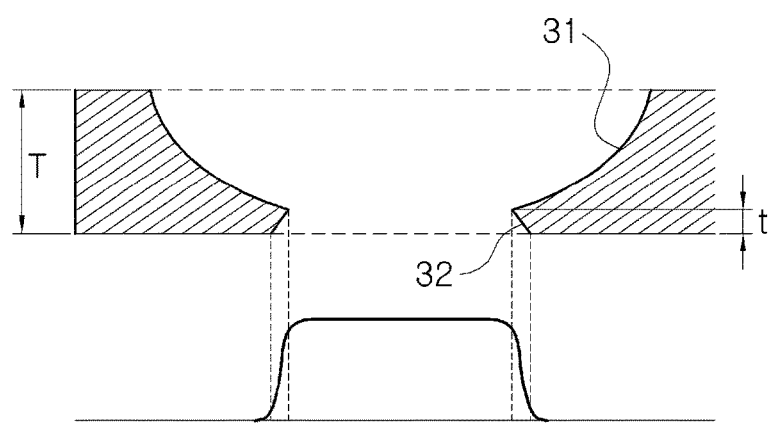
FIG. 3 is a schematic view of a shadow mask manufactured by conventional double-sided wet etching.
Figure 4:
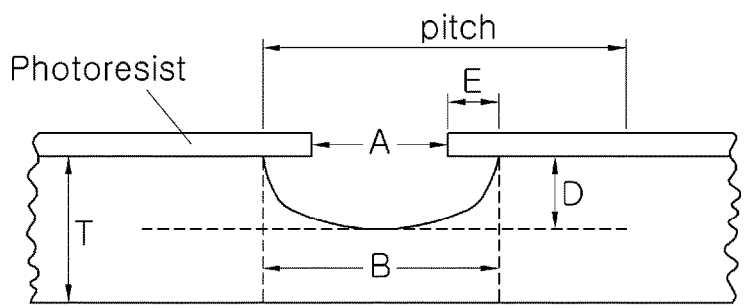
FIG. 4 is a view of explaining an isotropic shape of conventional wet etching (explaining formulas of (1), (2), and (3) showing correlations between factors of the shape (A, B, D, E, T, pitch, and Etch factor)).
Figure 5:
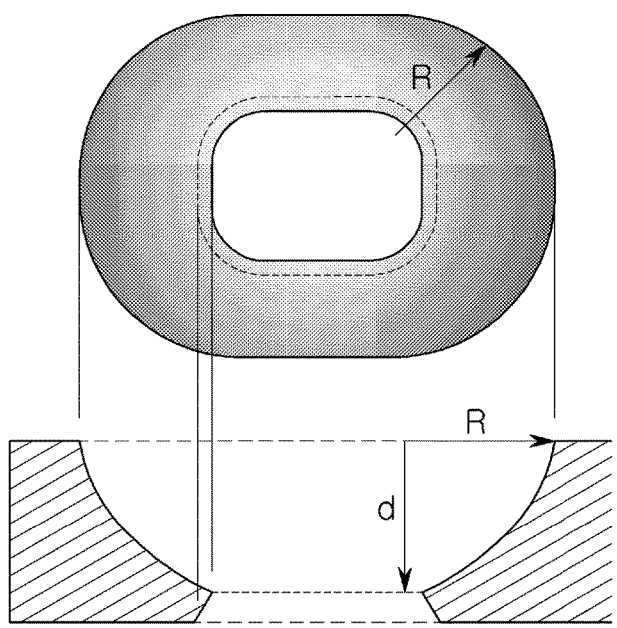
FIG. 5 is a view showing the isotropic shape drawn in a top plan view of conventional wet etching.
Figure 6:
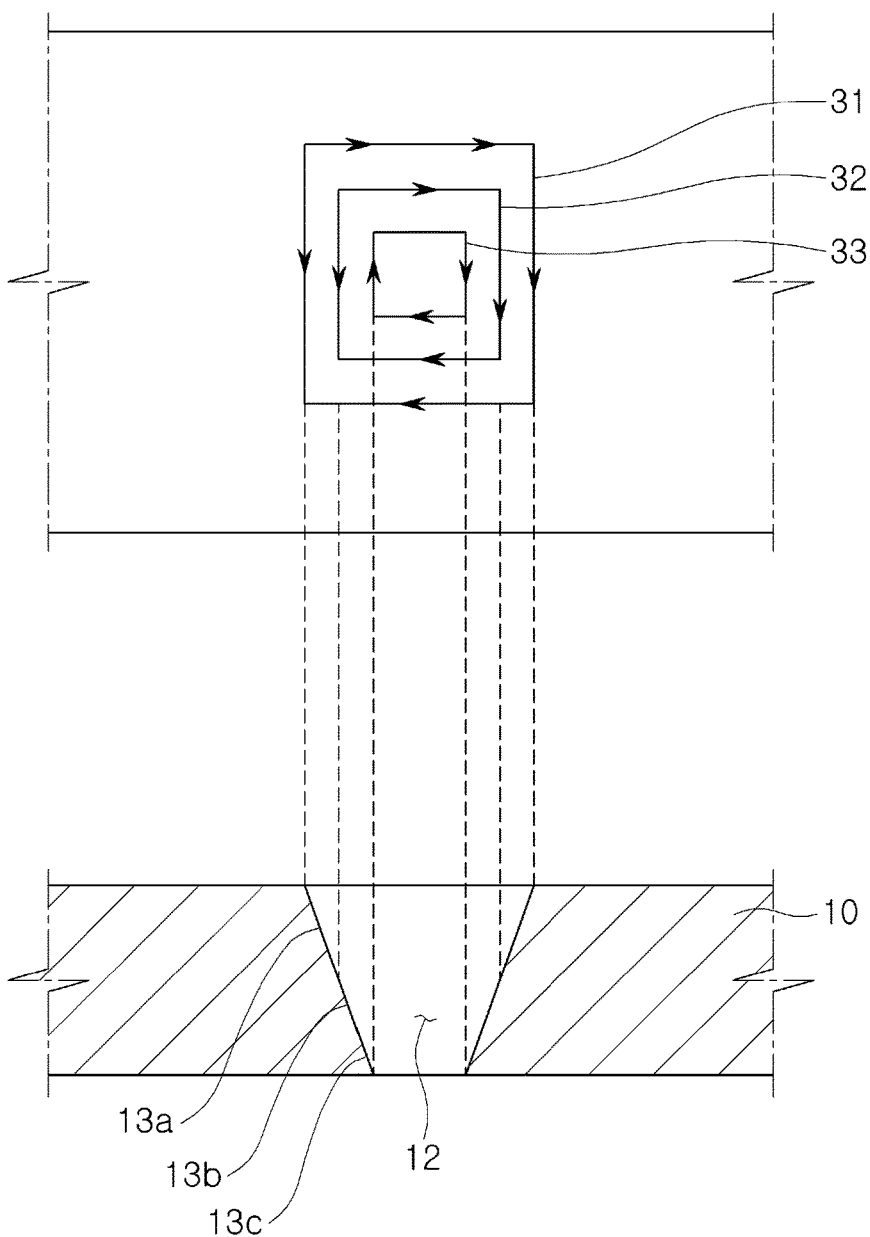
FIG. 6 is a schematic view of a method of manufacturing a shadow mask by conventional laser processing.
Figure 7:
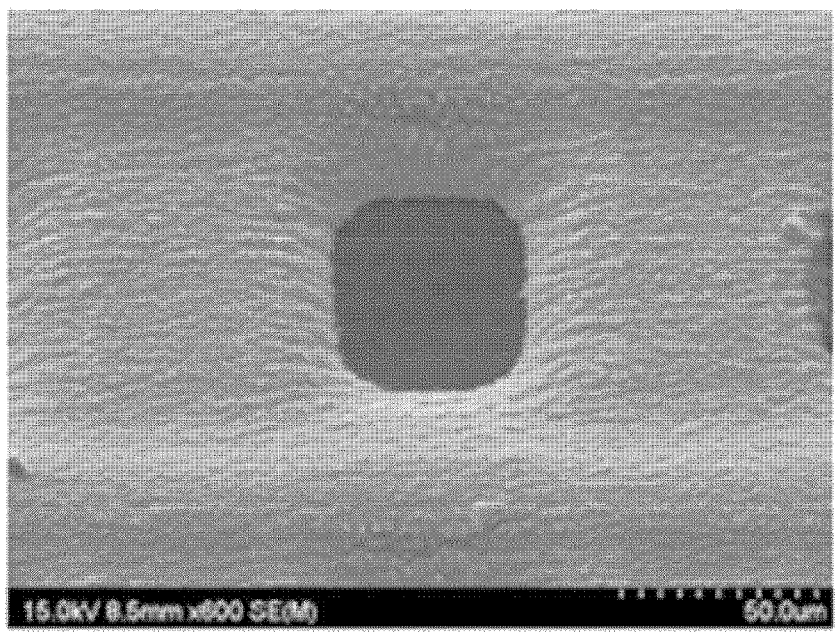
FIG. 7 is a view showing a photo of a shadow mask formed by using conventional laser processing.

As shown in FIG. 5, when a mask pattern is foiled by wet etching, according to the isotropic characteristic of wet etching, a radius of curvature R of a wet-etched surface of the wet-etched pattern is equal to a processing depth of a cross sectional surface of the wet etched pattern, in other words, a processing depth d of the wet-etched pattern. However, according to the present invention that uses hybrid processing, most of the aperture is formed by laser processing, and herein, a radius of curvature R of the wet-etched surface of the wet-etched pattern is implemented to be smaller than a processing depth d of the wet-etched pattern by adjusting an energy level of the laser beam for each position, in other words, R<d. Further, the radius of curvature R of the wet-etched surface of the wet-etched pattern may be adjusted to be certain value within a range below than the processing depth d.

Accordingly, the method of manufacturing the shadow mask of the present invention uses both wet etching and laser processing to solve productivity degradation of conventional laser processing and provides high quality of the shadow mask through wet etching.

In addition, the undercut problem caused by the isotropic characteristic of wet etching is solved by using hybrid processing including wet etching and laser processing. Accordingly, the gradual deposition of the electroluminescence material that is deposited on the substrate is prevented, boundary parts of the deposited electroluminescence material become clear, and thus performance of the display device is improved.

Further, in the present invention using hybrid processing, most of the aperture shape is formed by laser processing, and a radius value of curvature of a wet-etched surface of the wet-etched pattern is implemented below a limit value of wet etching by adjusting energy level of the laser beam for each position. Further, the radius value of curvature for the wet-etched surface of the wet-etched pattern may be adjusted to a certain value below the limit value. Accordingly, there is an effect on implementing various shapes of apertures.

Also, factors of the shape that are used for forming the mask pattern are not restricted to their limitations by using hybrid processing including wet etching and laser processing, and thus the shadow mask of the present invention is used for implementing display devices having resolutions of QHD (approximately 500 ppi) or UDH (approximately 800 ppi).

The invention claimed is:
1. A method of manufacturing a shadow mask, wherein hybrid processing is used to form a mask pattern on the shadow mask, the method comprising:
    forming a laser-processed pattern, having a cross-section with a tapered shape, by irradiating a laser beam from above a base, wherein a depth of a bottom of the tapered shape is smaller than a thickness of the base such that the base remains in the bottom of the tapered shape after the forming of the laser-processed pattern; and
    forming a wet-etched pattern that continues from the laser-processing pattern, by performing wet etching from above the base or from below the base on which the laser-processed pattern is formed, such that an opening through the base is generated.

2. The method of claim 1, wherein the forming of the laser-processed pattern comprises:
a first step of setting a unit processing area on the base;
a second step of performing laser processing to form a part of the laser-processed pattern within the unit processing area while moving the laser beam along a first scan path from a first boundary to a second boundary of the unit processing area;
a third step of turning the laser beam to a next direction, moving the laser beam by a step pitch, and performing laser processing to form another part of the laser-processed pattern within the unit processing area while moving the laser beam along a second scan path; and
a fourth step of repeating the second and third steps until finishing laser processing while moving the laser beam along an nth scan path, thereby completing laser processing over an entire area of the unit processing area.

3. The method of claim 2, wherein the forming of the laser-processed pattern further comprises:
setting a processing depth for each of the scan paths.

4. The method of claim 3, wherein the processing depth is determined by an overlap rate of the laser beam moving along the scan path [overlap rate={(size of laser beam-scan pitch)/size of laser beam}×100, scan pitch=v/f, v: relative speed of laser beam and base operated by operating part, f: pulse frequency of laser beam source applied to base].

5. The method of claim 3, wherein the processing depth is determined by a number of overlaps of the scan path.

6. The method of claim 3, wherein the processing depth is determined by setting intensity of the laser beam for each scan path, by setting energy intensity for each pulse of a laser beam source within one scan path, or by setting a combination of the two.

7. The method of claim 3, wherein the processing depth is determined by a combination of two or more of the following:
an overlap rate of the laser beam [overlap rate={(size of laser beam-scan pitch)/size of laser beam}×100, scan pitch=v/f, v: relative speed of laser beam source and base operated by operating part, f: pulse frequency of laser beam source applied to base];
a number of overlaps of the scan path; and
a setting of intensity of the laser beam for each scan path, or a setting of energy intensity for each pulse of a laser beam source.

8. The method of claim 2, wherein the laser-processed pattern is formed by setting the first to $n^{th}$ scan paths and first to $m^{th}$ scan paths, the first to $m^{th}$ scan paths being perpendicular to the first to $n^{th}$ scan paths.

9. The method of claim 8, wherein the laser-processed pattern is formed to be tapered by setting an accumulated energy distribution to a sequence of intensity of the laser beam according to the scan path.

10. The method of claim 2, wherein the forming the laser-processed pattern further comprises:
setting a plurality of energy areas on a laser-processed pattern area within the unit processing area; and
setting a processing depth for each of the energy areas by setting an accumulated energy distribution by the energy areas according to a sequence of intensity of the laser beam.

11. The method of claim 10, wherein the accumulated energy distribution by the energy areas is set by a number of overlaps of the scan path, or by setting an energy intensity change for each pulse of a laser beam source moving along the scan path.

12. The method of claim 10, wherein the laser-processed pattern is formed to be tapered by setting the accumulated energy distribution by the energy areas by sequentially setting a number of overlaps of the scan path, or by sequentially setting energy intensity for each pulse of a laser beam source moving along the scan path.

13. The method of claim 2, wherein a step pitch of the laser beam turning from an $n-1^{th}$ scan path to the $n^{th}$ scan path is equal to or smaller than a size of the laser beam of the $n-1^{th}$ scan path.

14. The method of claim 2, wherein the laser beam of the $n^{th}$ scan path moves in a direction same as or opposite to a direction of an $n-1^{th}$ scan path.

15. The method of claim 2, wherein an $n-1^{th}$ scan pitch and an $n^{th}$ scan pitch are set to have different values according to a shape of the laser-processed pattern (scan pitch=v/f, v: relative speed of laser beam and base operated by operating part, f: pulse frequency of laser beam source applied to base).

16. The method of claim 1, wherein the forming the wet-etched pattern comprises:
forming a photoresist pattern on an upper surface of the base to form the wet-etched pattern, and performing wet etching on the base along a photoresist-removed area.

17. The method of claim 16, wherein at the forming the wet-etched pattern, wet etching is performed on one surface of the base in a direction same as or opposite to a laser processing direction, or is sequentially or simultaneously performed on both surfaces of the base.

18. The method of claim 17, wherein the wet-etched pattern formed by wet etching is formed in the direction same as or opposite to the laser processing direction to continue from a laser-processed surface of the laser-processed pattern.

19. The method of claim 18, wherein the wet-etched pattern that is formed in the direction opposite to the laser processing direction to continue from the laser-processed surface of the laser-processed pattern, is formed up to or less than 40% of an entire thickness of the base.

20. The method of claim 1, wherein the wet-etched pattern has a radius of curvature of a wet-etched surface of the wet-etched pattern, the radius of curvature being smaller than a processing depth of the wet-etched pattern.

* * * * *